United States Patent
Fischer et al.

(10) Patent No.: US 6,680,654 B2
(45) Date of Patent: Jan. 20, 2004

(54) PHASE LOCKED LOOP WITH OFFSET CANCELLATION

(75) Inventors: Gerald R. Fischer, Playa Del Ray, CA (US); Talley J. Allen, Torrance, CA (US); Ken K. Tsai, Palos Verdes Estates, CA (US)

(73) Assignee: Northrop Grumman Corporation, Redondo Beach, CA (US)

( * ) Notice: Subject to any disclaimer, the term of this patent is extended or adjusted under 35 U.S.C. 154(b) by 120 days.

(21) Appl. No.: 09/999,679

(22) Filed: Oct. 24, 2001

(65) Prior Publication Data

US 2003/0076175 A1 Apr. 24, 2003

(51) Int. Cl.[7] ............................................. H03L 7/085
(52) U.S. Cl. ........................ 331/17; 331/8; 331/25; 327/156
(58) Field of Search ......................... 331/1 A, 8, 16, 331/17, 18, 25; 327/156–159; 332/127; 360/51; 375/376; 455/260

(56) References Cited

U.S. PATENT DOCUMENTS

| | | | | |
|---|---|---|---|---|
| 4,511,858 A | * | 4/1985 | Charavit et al. ............... 331/10 |
| 4,980,652 A | * | 12/1990 | Tarusawa et al. ............. 331/1 A |
| 5,408,195 A | * | 4/1995 | Miyazaki ..................... 329/325 |
| 5,604,465 A | * | 2/1997 | Farabaugh ..................... 331/10 |
| 5,656,975 A | * | 8/1997 | Imura ............................ 331/11 |
| 6,157,271 A | * | 12/2000 | Black et al. ................. 332/127 |

* cited by examiner

Primary Examiner—David C. Mis
(74) Attorney, Agent, or Firm—Harness, Dickey & Pierce, P.L.C.

(57) ABSTRACT

A phase locked loop (10) for generating a variable output frequency signal. The phase locked loop (10) includes a controlled oscillator (14) to generate the variable output frequency signal in response to a tune signal. A phase detector (18) is activable in response to a gating signal (20) to generate an error signal representing a difference between a reference frequency signal and the variable output frequency signal. A loop filter (12) having a filter characteristic, filters the error signal and generates the tune signal. An offset cancellation circuit (22) is coupled to the loop filter (12). In response to an error signal representing phase offset of the phase locked loop (10), the offset cancellation circuit (22) supplies a compensating signal to reduce the phase offset.

20 Claims, 3 Drawing Sheets

PHASE LOCKED LOOP WITH OFFSET CANCELLATION

BACKGROUND OF THE INVENTION

1. Field of the Invention

The present invention relates generally to phase locked frequency synthesizers, and in particular to phase locked loops that suppress the leakage of spurious energy, phase locked loops that switch bandwidth, or phase locked loops that require low phase offset.

2. Discussion of the Related Art

A phase locked loop (PLL) is a negative feedback system that maintains a constant phase and zero frequency difference between a variable frequency and a reference frequency. Conventional PLL's include a phase detector element to compare the frequency and phase of an oscillator to that of the reference frequency. The oscillator is then controlled to maintain the constant phase and frequency difference.

The speed with which the phase locked loop can transition from one lock point (or frequency) to the next is a limiting performance factor in many applications. The phase locked loop is therefore often designed with two or more control system bandwidths (or loop transfer functions): one is a very wide bandwidth that is used to rapidly tune the synthesizer away from the last locked frequency toward the new frequency, and another is the final narrow bandwidth that is used to provide stable low noise operation during the time that the new frequency is being supplied and the communication channel is active.

Generally, the PLL control system bandwidth must be sufficiently wide to rapidly tune the PLL away from the last locked frequency toward the new frequency. One common type of PLL uses an active integrator in the forward path to what is known as a second order control system. However, construction of an active integrator typically requires the use of a wideband operational amplifier to provide a sufficiently large PLL bandwidth. The wideband op-amp preferably includes performance characteristics such as low input bias current and voltage offset to reduce the effects of operating with offset phase caused by high bias current or offset voltage. Operating with offset phase may cause undesirable effects such as increased spurious energy from the phase detector or difficulty in smoothly switching between wideband and narrowband tracking modes. Conventional PLLs employ wideband FET input op-amps to reduce the effects of offset phase. However, wideband FET input op-amps are very expensive. A less expensive alternative to a FET input op-amp is a bipolar input op-amp. However, bipolar input op-amps universally have large input bias currents and at least modest offset voltages which result in operating with offset phase.

SUMMARY OF THE INVENTION

The phase locked loop system and method provides a system and method for generating a variable output frequency signal. The phase locked loop includes a controlled oscillator to generate the variable output frequency signal in response to a tune signal. A phase detector generates an error signal representing a difference between a reference frequency signal and the variable output frequency signal. A loop filter having a filter characteristic, filters the error signal and generates the tune signal. An offset cancellation circuit is coupled to the loop filter. In response to the error signal the offset cancellation circuit cancels errors associated with the loop filter.

For a more complete understanding of the invention, its objects and advantages, reference may be had to the following specification and to the accompanying drawings.

DETAILED DESCRIPTION OF THE EMBODIMENTS

Figure 1:
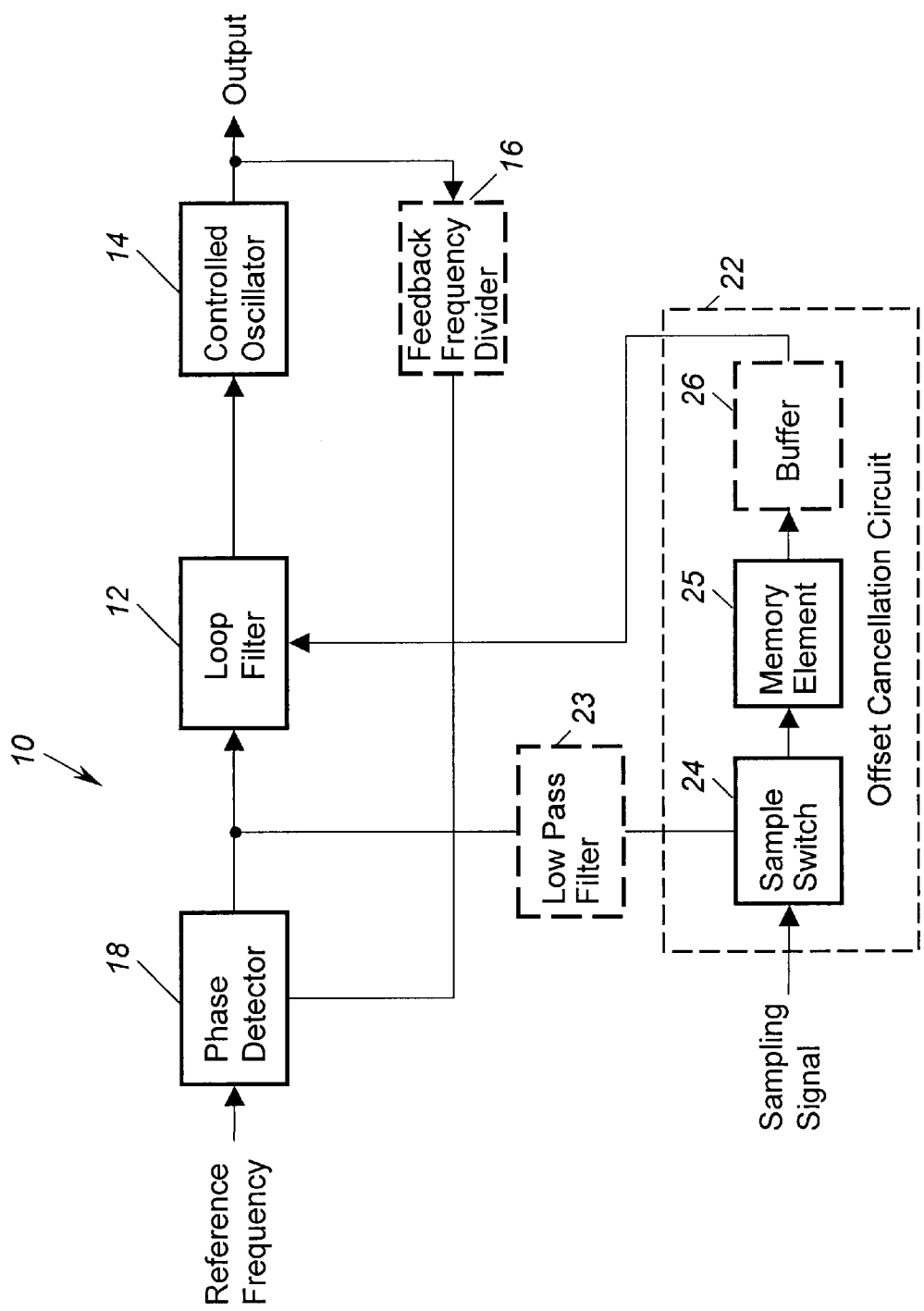
FIG. 1 illustrates a block diagram of a phase locked loop with phase offset compensation in accordance with the teachings of the invention.

Referring to FIG. 1, a phase locked loop 10 according to the present invention is shown. The PLL 10 includes a controlled oscillator 14 for generating an output frequency signal in response to a tuning signal. A feedback frequency divider 16 is preferably included, although not required since the PLL 10 is not limited to circuits that are capable of switching frequencies. The feedback frequency divider 16 senses the output frequency signal and generates a divided frequency signal. A phase detector 18 compares the frequency and phase of the divided frequency signal to the frequency and phase of a reference frequency signal and generates an error signal to represent the difference between the reference frequency signal and the divided frequency signal. A loop filter 12 coupled to the phase detector 18 generates the tuning signal from the error signal. The loop filter 12 attenuates injected noise and removes high frequency components that are present in the error signal. The loop filter 12 includes at least one active device such as an operational amplifier.

An offset cancellation circuit 22 coupled from the phase detector 18 to the loop filter 12 generates a cancellation signal that compensates for error components of the loop filter 12 such as input stage bias currents and offset voltages. The cancellation signal is injected into the loop filter 12 to reduce phase offsets caused by the loop filter error components. The offset cancellation circuit 22 takes a sample of a voltage within the PLL 10 that represents phase error. A sample switch 24 preferably samples the phase error at a time when the transient phase error is at a minimum such as well after any transients caused by acquisition or bandwidth switching. A non-zero sample value is taken as an indication that a phase offset due to at least one of the error components of the loop filter 12 is present. The sample is used to increment a memory element 25 that controls the amplitude of the cancellation signal. The memory element 25 is preferably an active filter circuit such as an integrator, however the scope of the invention includes digital memories. The output of the memory element 25 is preferably buffered by a buffer 26, although a buffer is not required. The cancellation signal is coupled from the buffer 26 to the loop filter 12. Preferably, samples are taken regularly so that the offset cancellation circuit 22 has regular opportunities to monitor the effect of offset and update the memory element 25 that controls the quantity of the cancellation signal. Preferably, the monitoring opportunities are sufficiently frequent so that changes in the circuit operating characteristics can be compensated for by the offset cancellation circuit 22. Examples of changing operating characteristics include the effects of temperature drift on bias currents and offset voltages, leakage current changes in the memory element, and component variations in the offset cancellation circuit 22.

The scope of the invention includes using several types of phase detectors such as mixer-based phase detectors that generate a difference signal that comprises an AC component with a DC offset, wherein the DC offset indicates the amount of the difference and the frequency of the AC component is related to frequencies of the detected signals. A low pass filter 23 is preferably inserted between the phase detector 18 and the offset cancellation circuit 22 to attenuate the AC signal. The filtered error signal is sampled by the offset cancellation circuit 22 at a time when the transient phase error is at a minimum, such as well after any transients caused by acquisition or bandwidth switching.

The error signal may also be directly coupled to the offset cancellation circuit 22. In this instance the error signal is sampled at a predetermined instant within a cycle so that the AC component of the signal may be negated, leaving the DC offset as the error signal.

Another well known phase detector generates a difference signal that is comprised of a series of pulses that correspond to the difference. The duration of an error signal pulse reflects the magnitude of the difference in the phases of the signals. Preferably, the error signal pulse is converted to a voltage level by a filter such a low pass filter. The voltage level represents the magnitude of the difference and is used for determining the amount of cancellation signal to be injected. Another example of the memory element 25 includes a digital timing circuit that measures the relative width of the error signal pulse.

Figure 2:
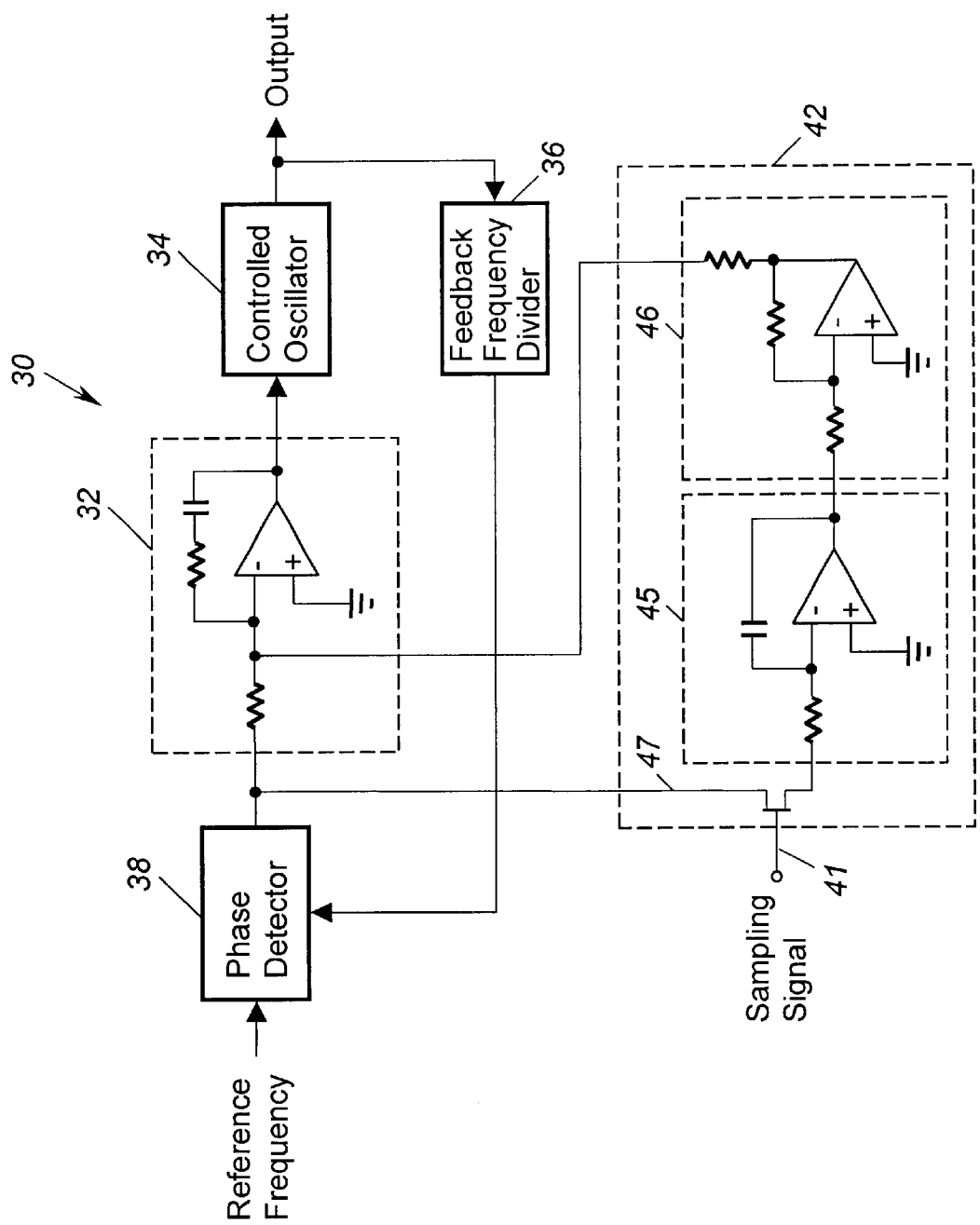
FIG. 2 illustrates a circuit diagram of a presently preferred embodiment of a phase locked loop with phase offset compensation in accordance with the teachings of the invention.

Referring to FIG. 2, a schematic of a presently preferred embodiment of a phase locked loop 30 in accordance with the teachings of the invention is illustrated. The phase locked loop 30 includes a loop filter 32, a voltage controlled oscillator 34, a feedback frequency divider 36, a phase detector 38, and an offset cancellation circuit 42. The loop filter 32 includes an amplifier configured as an integrator.

In the presently preferred embodiment, the phase detector 18 generates a difference signal that is comprised of a series of pulses that correspond to the difference. The duration of an error signal pulse reflects the magnitude of the difference in the phases of the signals.

The offset cancellation circuit 42 includes a sampling switch 47 that is controlled by a sampling signal 41 that preferably takes a sample of a voltage within the PLL 30 that represents phase error at a time when the transient phase error should be at a minimum. The sampling switch 47 is preferably coupled to the phase detector 38 to sample the error signal pulses that are generated by the phase detector 38. The sampling switch 47 is preferably a field effect transistor (FET), however the scope of the invention includes using other controllable devices such as bipolar junction transistors.

A memory device 45 stores the voltage level of the sampled error pulse preferably until another sample is received. The scope of the invention includes using both digital memory devices as well as analog memory devices. Examples of digital memory devices include a processor/controller in combination with memory to store a digital representation of the phase error. Examples of analog memory devices include sample and hold circuits, active filters, and inductive storage circuits. The memory device 45 in the presently preferred embodiment is an amplifier configured as an integrator. In response to receiving an error pulse, the integrator generates an output voltage that is incrementally increased or decreased according to the charge represented by the product of the error voltage level and pulse duration of the error voltage. The output voltage of the memory device 45 is coupled to a buffer 46.

The buffer 46 forms a compensating injection current corresponding to the memory device output voltage. The injection current is injected into an input of the loop filter 32 to compensate for error components associated with the amplifier. In the presently preferred embodiment the buffer 46 is configured as an inverter with a resistor in series with the output to convert the output voltage of the buffer 46 to an injection current. The injection current from the buffer 46 is preferably coupled as a current into an input of the amplifier that is coupled to the phase detector 38. In the presently preferred embodiment, the injection current is injected as a current into one of the amplifier inputs. However, it is within the scope of the invention to inject current into each amplifier input as well as injecting a voltage into one or more amplifier inputs.

In operation, the sampling switch 47 samples the error signal from the phase detector 38 a predetermined time period after transients from acquisition have decayed. A non-zero sample value is taken as an indication that a phase error is present and the sample is used to increment the memory device 45. The sampled error signal provides an error voltage to the memory device 45 that corresponds to error components associated with the loop filter 32. The memory device 45 transitions towards a voltage that is sufficient to produce a compensating current injection from the buffer 46. Several cycles may be required before the compensating current from the offset compensation circuit 42 cancels the effects of loop filter error components. The cancellation loop reaches a steady state solution when the phase offset is approximately zero and the charge injected into the loop filter 32 approximately balances the original phase offset.

Figure 3:
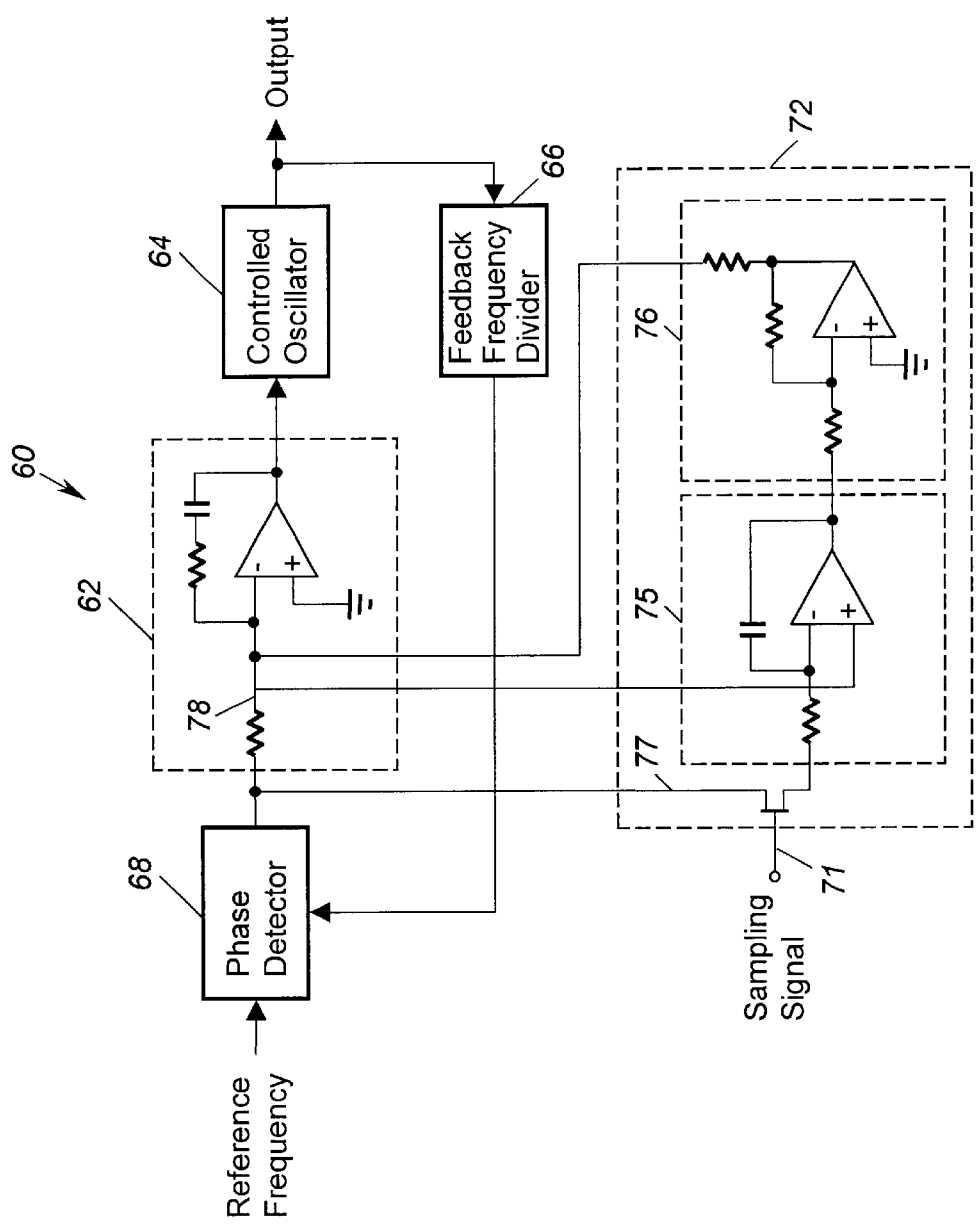
FIG. 3 illustrates a circuit diagram of another embodiment of a phase locked loop with phase offset compensation in accordance with the teachings of the invention.

Referring to FIG. 3, a schematic of another embodiment of a phase locked loop 60 in accordance with the teachings of the invention is illustrated. The phase locked loop 60 is similar to phase locked loop 30 in function with corresponding elements numbered in the range of 60 to 80, except that the input of the offset cancellation circuit 72 of PLL 60 is coupled across an input resistor 78 of the loop filter 62 instead of to an output of the phase detector 68. The error measurement of PLL 60 is more directly related to the bias current of the loop filter 32, minimizing the impact of other phase offset sources such as the voltage offset of the loop filter 62. Similar to PLL 30, the injection current is injected as a current into a single one of the amplifier inputs. However, it is within the scope of the invention to inject current into each amplifier input as well as injecting a voltage into one or more amplifier inputs.

Thus it will be appreciated from the above that as a result of the present invention, a system and method for generating a variable frequency output signal is provided by which the principal objectives, among others, are completely fulfilled. It will be equally apparent and is contemplated that modification and/or changes may be made in the illustrated embodiment without departure from the invention. Accordingly, it is expressly intended that the foregoing description and accompanying drawings are illustrative of preferred embodiments only, not limiting, and that the true spirit and scope of the present invention will be determined by reference to the appended claims and their legal equivalent.

What is claimed is:

1. A phase locked loop comprising:
   a controlled oscillator to generate a variable output frequency signal in response to a tune signal;
   a phase detector to generate an error signal representing a difference between a reference frequency signal and the variable output frequency signal;
   a loop filter having filter characteristics to filter the error signal and generate the tune signal; and
   an offset cancellation circuit that is adapted to receive the error signal from the phase detector, the offset cancellation circuit being responsive to the error signal during a time period when the error signal represents phase offset and operable to supply a compensating signal that compensates for error components associated with the loop filter such that the phase offset is reduced.

2. The phase locked loop of claim 1 wherein the loop filter is an active integrator.

3. The phase locked loop of claim 1 wherein the offset cancellation circuit is coupled between the phase detector and the loop filter.

4. The phase locked loop of claim 1 wherein the offset cancellation circuit includes:
   a sample switch to sample the error signal a predetermined time period after a transient event; and
   a memory device coupled to the sample switch to store the error signal corresponding to phase offset, and supply the compensating charge to the loop filter.

5. The phase locked loop of claim 1 wherein the error components are selected from the group of bias currents, offset currents, and offset voltages.

6. The phase locked loop of claim 1 further comprising a feedback frequency divider coupled between the controlled oscillator and the phase detector, the feedback frequency divider operable to generate a divided frequency signal from the variable output frequency signal.

7. The phase locked loop of claim 6 wherein the offset cancellation circuit includes:
   a sample switch to sample the error signal a predetermined time period after a transient event; and
   a memory device to store phase offset information and supply the compensating charge to the loop filter.

8. The phase locked loop of claim 1 wherein the offset cancellation circuit samples the error signal a predetermined time period after a transient such that the phase offset is at a minimum.

9. The phase locked loop of claim 1 wherein the error signal includes a series of pulses that correspond to the difference.

10. The phase locked loop of claim 1 wherein the error signal includes an AC component with a DC offset, the DC offset indicating the difference.

11. The phase locked loop of claim 2 wherein the offset cancellation circuit is operable to supply the compensation charge to an inverting input terminal of the active integrator.

12. A phase locked loop comprising:
    a controlled oscillator to generate a variable output frequency signal in response to a tune signal;
    a feedback frequency divider coupled to the controlled oscillator, operable to generate a divided frequency signal from the variable output frequency signal;
    a phase detector to generate an error signal representing a difference between a reference frequency signal and the divided frequency signal, the error signal including a series of pulses that correspond to the difference;
    a loop filter to filter the error signal and generate the tune signal, the loop filter including an amplifier; and
    an offset cancellation circuit that is adapted to receive the error signal from the phase detector, the offset cancellation circuit being responsive to the error signal and operable to supply a compensation signal to the loop filter to compensate for an error component associated with the amplifier.

13. The phase locked loop of claim 12 wherein the offset cancellation circuit includes a memory device for storing phase error information.

14. The phase locked loop of claim 12 wherein the offset cancellation circuit includes a sample switch, activable in response to a sampling signal, to sample the phase detector error signal; and
    a memory device coupled to the sample switch, to store the phase error information.

15. The phase locked loop of claim 12 wherein the amplifier error component is selected from the group of; bias currents, offset current, offset voltage, and combinations thereof.

16. The phase locked loop of claim 12 wherein the loop filter is an active integrator.

17. A phase locked loop comprising:
    means for generating a variable output frequency signal corresponding to a tune signal;
    means for frequency dividing the variable output frequency signal such that a divided frequency signal is generated;
    means for detecting a difference between a reference frequency signal and the divided frequency signal;
    means for generating an error signal representing the difference, the error signal including a series of pulses to represent the difference;
    means for filtering to filter the error signal and generate the tune signal; and
    an offset cancellation circuit coupled to the means for filtering, responsive to the error signal, to generate a compensation signal for reducing phase offsets associated with error components of the filtering means.

18. A method of generating a controlled frequency signal, comprising:
    generating a variable output frequency signal in response to a tune signal;
    in response to a gating signal, detecting a difference between a reference frequency signal and the variable output frequency signal;
    generating an error signal having a series of pulses to represent the difference;
    filtering the error signal such that the tune signal is generated;
    responsive to a sampling signal, storing the error signal during a time period when the error signal represents a phase offset of the phase locked loop;
    generating a compensating signal based upon the phase offset; and
    combining the compensating signal with the error signal to reduce the phase offset.

19. The method of claim 18 wherein the phase offset is caused by error components associated with the step of filtering.

20. The method of claim 18 wherein the time period for storing the error signal is a predetermined time period after a transient.

* * * * *